(12) United States Patent
Pang

(10) Patent No.: US 8,420,925 B2
(45) Date of Patent: Apr. 16, 2013

(54) SOLAR ENERGY DEVICE FOR ELECTRICITY AND HEATING

(76) Inventor: Yi Pang, Gaithersburg, MD (US)

( * ) Notice: Subject to any disclaimer, the term of this patent is extended or adjusted under 35 U.S.C. 154(b) by 991 days.

(21) Appl. No.: 11/953,027

(22) Filed: Dec. 8, 2007

(65) Prior Publication Data

US 2009/0145474 A1   Jun. 11, 2009

(51) Int. Cl.
*H01L 31/058* (2006.01)

(52) U.S. Cl.
USPC ........... 136/246; 136/247; 136/248; 126/639; 126/652; 126/684; 126/690

(58) Field of Classification Search .......... 136/246–248; 126/684, 690, 652, 639
See application file for complete search history.

(56) References Cited

U.S. PATENT DOCUMENTS

| | | | |
|---|---|---|---|
| 3,602,721 A | 8/1971 | Nakamura et al. | |
| 4,143,233 A * | 3/1979 | Kapany et al. | 136/259 |
| 4,144,095 A | 3/1979 | Mlavsky | |
| 4,146,407 A | 3/1979 | Litsenko et al. | |
| 4,184,482 A * | 1/1980 | Cohen | 126/606 |
| RE30,584 E | 4/1981 | Russell | |
| 4,323,052 A | 4/1982 | Stark | |
| 4,334,120 A | 6/1982 | Yamano et al. | |
| 4,529,831 A | 7/1985 | Gill et al. | |
| 5,365,920 A | 11/1994 | Lechner | |
| 5,882,434 A * | 3/1999 | Horne | 136/246 |
| 6,018,122 A * | 1/2000 | Hibino et al. | 136/246 |

* cited by examiner

*Primary Examiner* — Jennifer Michener
*Assistant Examiner* — Matthew Martin
(74) *Attorney, Agent, or Firm* — Louis Ventre, Jr.

(57) ABSTRACT

A solar energy collector produces electricity and heat using an optically transparent vessel containing one or more photovoltaic cells and a liquid that substantially fills the vessel. The vessel has a top with a flat exterior surface and a bottom with a concave exterior surface that is coated on the outside with a reflective material. Solar radiation traveling through the top of the vessel into the liquid and through the bottom strikes the reflective material on the outside of the vessel and is reflected back through the bottom, into the liquid and to a focal line adjacent to the interior surface of the top. Cooled liquid is fed into the vessel through an entry port and heated liquid is removed through an exit port. One or more photovoltaic solar cells are located adjacent to the interior surface of the top aligned with the focal line.

4 Claims, 3 Drawing Sheets

SOLAR ENERGY DEVICE FOR ELECTRICITY AND HEATING

FIELD OF INVENTION

In the field of solar energy conversion, a device that converts the majority of solar energy collected by it into electricity and heat and is efficient, low cost, and easy to manufacture.

BACKGROUND OF THE INVENTION

The invention is a solar energy collector that produces electricity and heat using an optically transparent vessel containing photovoltaic cells and substantially filled with a non-conducting, optically transparent liquid, used for removing heat.

Devices that produce both electricity and heat from concentrated solar energy are known. However, such devices have been disclosed primarily using concentrated refracted solar energy, which are less effective in concentrating solar radiation. Concentrated refracted solar energy devices typically require a liquid with a high refractive index and a sun-tracker capable of orienting the device along two axes: the vertical orientation of the major axis, which is in effect rotation of the device about its minor axis; and the horizontal orientation of the minor axis, which is in effect rotation of the device about its major or longitudinal axis.

Concentrated refracted solar energy involves passing solar radiation through a lens to focus it and thus concentrate its effect. The present device does not use refracted or lens-concentrated solar energy. Rather, the present invention utilizes concentrated reflected solar energy. By so doing, the present invention can produce a higher concentration of sunlight with simple shapes, especially when a parabolic shape is used for the bottom exterior surface. Also, the present invention requires sun tracking only along a single axis, namely, rotation around its longitudinal axis. No complex two-axes tracking is required. Once the longitudinal axis of the present invention is aligned along the east-west direction, there is no need for large directional adjustment, only "fine tuning," i.e., smaller and more precise adjustment is needed only for any seasonal change or slight misalignment of the device.

To produce a comparable concentration, a refractive device would need to a complex configuration with multiple lenses. With a simple design, the present invention improves efficiency while reducing the weight and quantity of material often associated with refractive devices. Overall, the present invention has advantages in lower-cost manufacture, ease of manufacture and broader application potential for backfitting to existing buildings.

The apparatus of the present invention concentrates sunlight via reflection, that is, the area of the sunlight used for the production of electricity is greatly reduced from the unconcentrated area of illumination by the sunlight. This reduced area of sunlight enables use of fewer solar cells to achieve the same electrical output for the solar energy impinging on the apparatus. Thus, it either enables use of fewer cells for the same electrical output, or for a comparable cost, it enables the use of high-efficiency photovoltaic cells, such as multi-junction solar cells. When a high-efficiency photovoltaic cell is utilized, the invention can translate to a more efficient device with a lower cost per unit of power.

The present invention combines a photovoltaic cell and a means for heat extraction in a unique arrangement to promote efficient operation of both means for extracting useful energy from solar radiation. It is known that a photovoltaic cell can produce electricity from sunlight and its efficiency can be maximized by maintaining the cell as close to ambient temperature as reasonably achievable in the presence of concentrated sunlight. The key to higher efficiency is to provide solar cell temperature regulation while at the same time enabling the extraction of the heat energy created by the sunlight. Therefore, the present invention enables a reflecting solar concentrator to be effective in producing electricity from one or more solar cells maintained near ambient temperatures and to easily extract the heat energy.

An alternative embodiment of the present invention employs solar tracking to rotate the apparatus so that solar radiation enters latitudinally perpendicular to the apparatus. Solar tracking is well known in the art. However, a specific means for achieving solar tracking is described for the present invention. Essentially, the vessel used in the apparatus is rotated about its longitudinal axis to achieve focusing. Two parallel solar cells on the inside top of the vessel are used to measure variation in relative radiation intensities and thereby send signals to rotate the vessel.

DESCRIPTION OF PRIOR ART

The prior art in this category relates primarily to concentrated refracted solar energy and is also different in a number of other ways. An example is U.S. Pat. RE30,584, which teaches an optical concentrator and cooling system in which a photovoltaic cell array is immersed in a liquid coolant inside an elongated tube having a curved transparent wall, which is a lens, to focus incident radiation by refraction on a photovoltaic cell array. To operate effectively, this tube must be adjusted along two axes with direction of the sunlight, that is, so that the sunlight is longitudinally perpendicular, and latitudinally aligned to its axis of symmetry. Two-axes adjustment is needed because if sunlight is not perpendicular to the longitudinal axis of the tube, then latitudinally, the governing refraction equation $k=\sin(\alpha)/\sin(\beta)$ is no longer true and focusing is less effective.

While the present invention uses a coolant surrounding a photovoltaic cell, the present invention is different in that it does not concentrate the solar energy via refraction. Thus, the functionality of the present invention is via a completely different mechanism, which is reflection rather than refraction. This means that because refraction is not important, there is no limitation on the refractive index of the liquid coolant. In contrast, the '584 patent requires that the coolant have refractive index suitable for concentrating the incident radiation onto the photovoltaic cell array. With typical refractive indices of available liquids, calculation shows that no more than a factor of 5 concentration of incident solar energy can be achieved with the '584 device. Additionally, the present invention uses an external reflective coating not found in this type of application. With a parabolic reflective shape of the present invention, it is a mathematical possibility to focus the sunlight to arbitrarily small size.

An example can be given of the weight savings of the present invention compared to a refractive device described by the '584 patent. Assume comparison of devices using the same concentration factor (e.g., x100, which is difficult to achieve with refractive device) and same solar cell width (e.g., 1 mm), the refractive device would have the diameter of 10 cm, and the parabolic reflective device of the present invention would have a width of about 10 cm but a height of only about 25 mm (1 inch). This translates to a substantial savings in material and weight.

Accordingly, the present invention will serve to improve the state of the art by providing a highly efficient device for producing electricity and heat from solar radiation that substantially reduces the weight and material previously needed for such purposes. Reduced weight and material translates to broader application potential to existing building structures. A reduced weight solar energy device also translates to lower manufacturing costs. Additionally, the simple design of the present invention enables ease of manufacture that contributes to reducing costs per unit of power produced.

BRIEF SUMMARY OF THE INVENTION

A solar energy collector produces electricity and heat using an optically transparent vessel containing one or more photovoltaic cell. The vessel is substantially filled with a non-conducting, optically transparent liquid, such as silicon oil, used for removing heat. The vessel wall has a refractive index about the same as the liquid. The vessel is shaped in cross-section to have a top with a flat exterior surface so that solar radiation passing through the top enters the vessel in substantially parallel rays. The vessel has a bottom with a concave exterior surface, preferably a parabolic shape, which is coated on the outside with a reflective material. This shape enables solar radiation traveling through the top of the vessel into the liquid and through the bottom to strike the reflective material on the outside of the vessel and be reflected back through the bottom, into the liquid and to a focal line adjacent to the interior surface of the top. The vessel has an entry port to enable introduction of cooled liquid into the vessel and an exit port to enable removal of liquid heated by solar radiation. A photovoltaic solar cell is located adjacent to the interior surface of the top aligned with the focal line. A tracking device to align the device with the sun's movement may be used.

BRIEF DESCRIPTION OF THE DRAWINGS

The reference numbers in the drawings are used consistently throughout. New reference numbers in FIG. 2 are given the 200 series numbers and in FIG. 3 are given 300 series numbers.

DETAILED DESCRIPTION

In the following description, reference is made to the accompanying drawings, which form a part hereof and which illustrate several embodiments of the present invention. The drawings and the preferred embodiments of the invention are presented with the understanding that the present invention is susceptible of embodiments in many different forms and, therefore, other embodiments may be utilized and structural and operational changes may be made without departing from the scope of the present invention.

Figure 1:
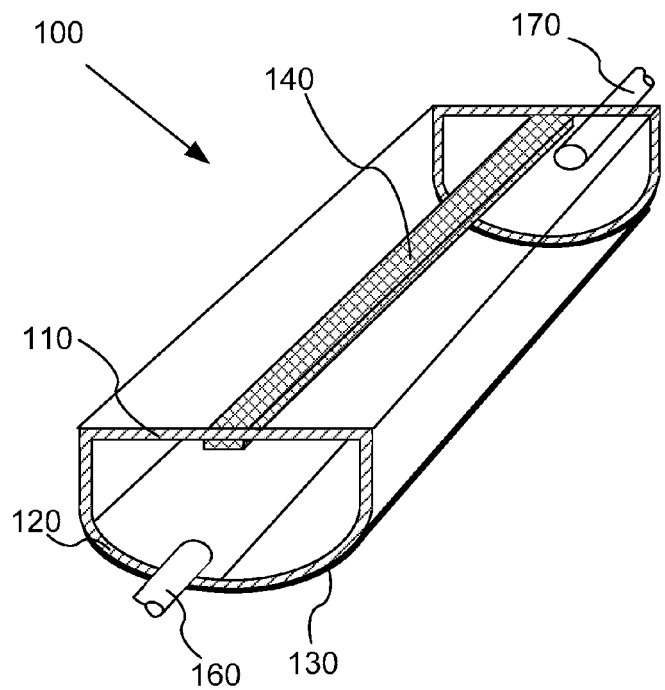
FIG. 1 is a perspective of a preferred embodiment of the invention.
Figure 2:
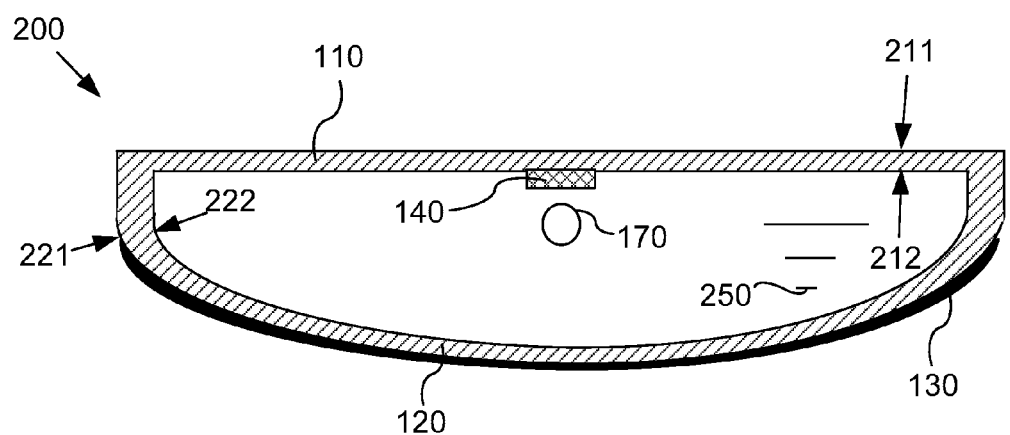
FIG. 2 is a sectional view of an alternative preferred embodiment of the invention.

FIG. 1 shows a perspective of a preferred embodiment of the apparatus (100) for collecting solar radiation for electricity production and heat and FIG. 2 shows a cross section of a squatter preferred embodiment of the apparatus (200). Each preferred apparatus comprises liquid (250), a vessel and a photovoltaic cell (140).

Sunlight would enter the vessel through the wall at the flat exterior surface of the top (110), pass through a liquid (250) that substantially fills the vessel, pass through the wall at the bottom (120), and strike a reflective material (130) that coats the concave exterior surface (221) of the wall at the bottom (120), which is preferably parabolic in shape. The sunlight would then be reflected back through the wall at the bottom (120), pass through the liquid (250) and onto one or more solar cells, that is a photovoltaic cell (140), located on the wall at the top (110) along a focal line of the concave shape.

The liquid (250) is non-conducting so that it does not adversely affect the production of electricity in the normal operation of the photovoltaic cell (140). The liquid (250) is optically transparent so that sunlight can pass through the liquid (250) to the reflecting material (130) and on its way back to the photovoltaic cell (140). The liquid (250) serves as a heat sink for solar radiation and a means to cool the photovoltaic cell (140). A liquid meeting these requirements is silicon oil. To reduce weight in transport and to ease installation, the liquid may be added as a last step in installation.

The vessel wall, composed of the top (110) and bottom (120), is optically transparent so that solar radiation can pass through the wall. Optically transparent glass or plastic materials are well known for this type of application. The vessel wall preferably has a refractive index about the same as the liquid (250) so that the light is not refracted or bent when it passes from the wall to the liquid (250).

The wall at the top (110) has a flat exterior surface (212) such that solar radiation passing through the top enters the vessel in substantially parallel rays. The interior surface (211) of the wall at the top (110) is shown also as flat, but it need not be flat in all applications. When the refractive index of the wall and the liquid (250) is the same, the shape of the top interior surface does not affect operation of the device.

The wall at the bottom (120) has a concave exterior surface (221). The interior surface (222) of the wall at the bottom (120) is shown also as concave but it need not be concave in all applications. The concave exterior surface (221) is coated with a reflective material, or mirror-like material, so that parallel rays of solar radiation traveling through the wall at the bottom (120) will strike the reflective material and be reflected back through the wall at the bottom (120) to a focal line adjacent to the interior surface (212) of the wall at the top (110).

This embodiment has an entry port (170) to enable introduction of cooled liquid (250) into the vessel. This embodiment also has an exit port (160) to enable removal of liquid (250) heated by solar radiation. These ports enable liquid (250) to be introduced at a cold temperature and removed at an elevated temperature. Once removed, liquid at elevated temperature may be piped to a heat exchanger to cool it for reintroduction into the vessel. Examples of a useful heat exchanger are a system for space heating, a water tank inside a building or a radiator in a house to directly heat the house. These examples are well known in the art.

The ports also enable more than one vessel to be connected in series or parallel in a coolant system distribution system. An example of a connection in series is connecting the exit port of a first vessel to the entry port of a second vessel. An example of a connection in parallel is connecting the first and second vessel entry ports to a common feeder pipe and the first and second vessel exit ports to a common suction pipe. To maintain as low-cost and as light a package as possible, flexible tubing can be used to connect multiple vessels together. A casing may be used to house multiple vessels so connected and each casing would then constitute a solar panel module.

The photovoltaic cell (140) in this embodiment is located adjacent to the interior surface (212) of the top (110) aligned with the focal line of the concave exterior surface (221) of the exterior of the wall at the bottom (120). If multiple vessels are involved in an application, one or more photovoltaic cells in each vessel can be electrically connected in series or parallel to vary the current or voltage obtainable from the photovoltaic cells. Such connections are well known in the art.

Figure 3:
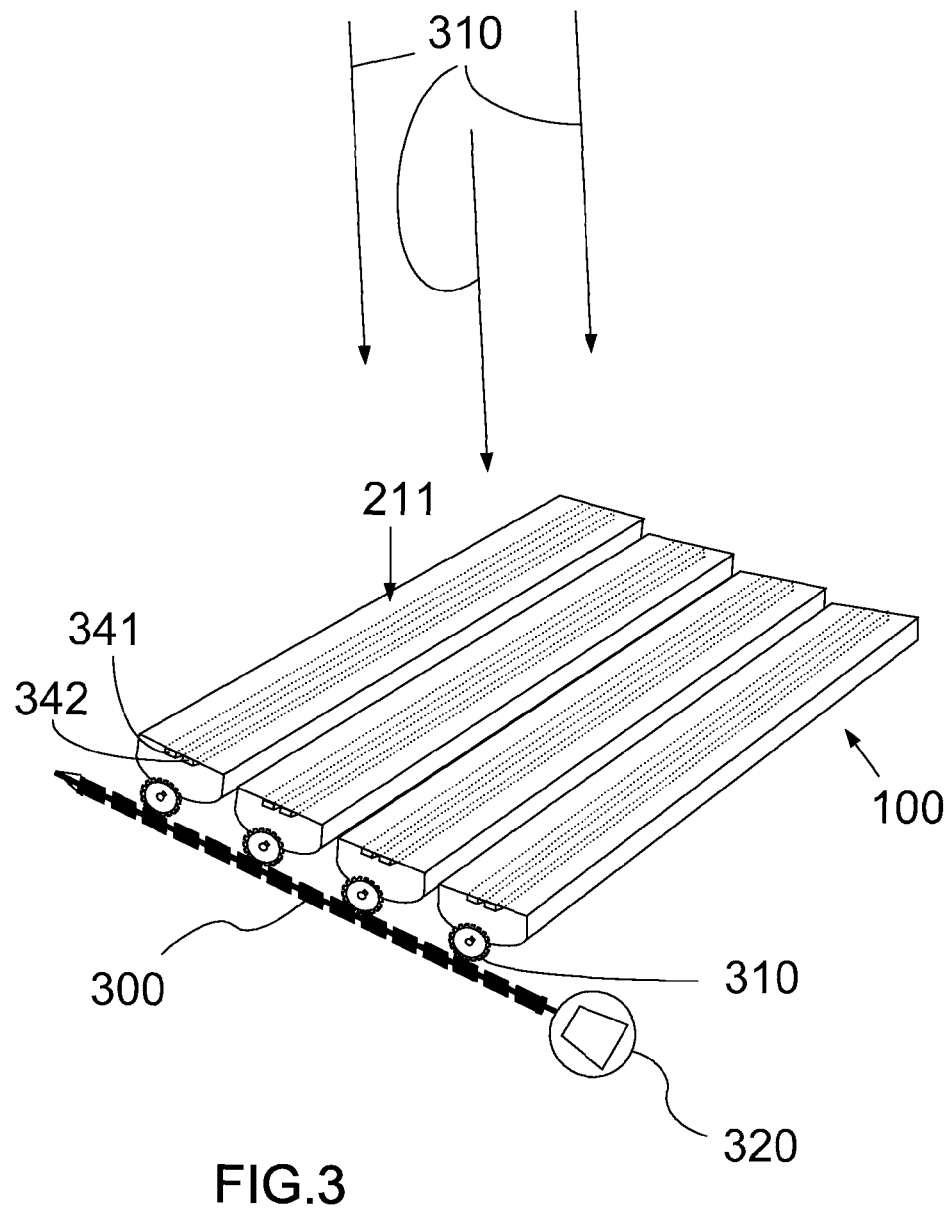
FIG. 3 is a side view of a preferred embodiment of the invention mounted on a sun tracker.

FIG. 3 shows an alternative embodiment of the invention that uses a means for rotating the apparatus such that sunlight (310) impinges substantially latitudinally perpendicularly to the flat exterior surface (211) of the wall at the top (110).

Figure 4:
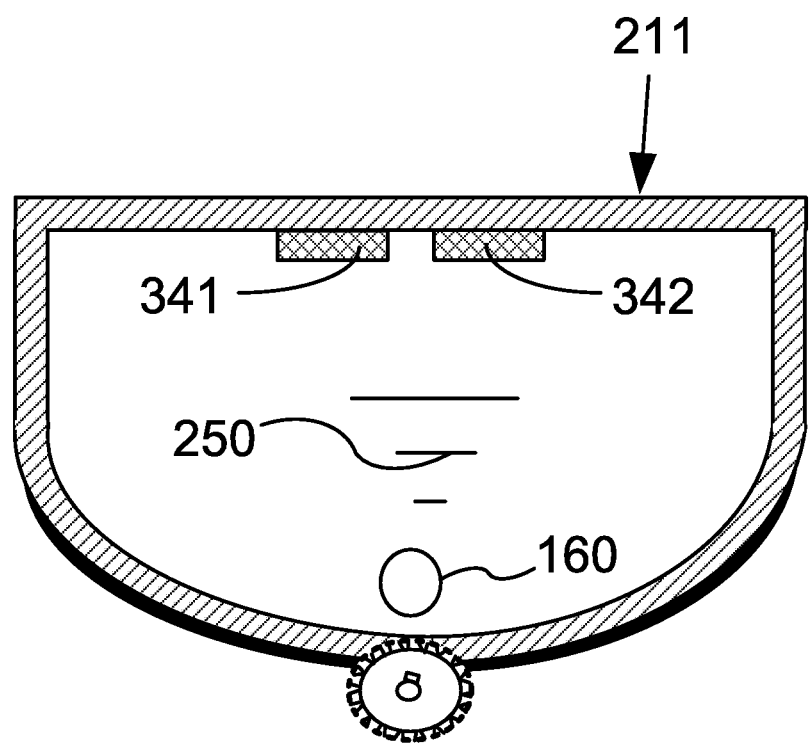
FIG. 4 is a cross-sectional view of the vessel used in the preferred embodiment of the invention mounted on a sun tracker.

FIG. 4 shows a cross section of the vessel used in the embodiment shown in FIG. 3.

The means for rotating preferably includes a worm gear (300) operated by a servo-motor (320). Each vessel is attached to a gear (310) that engages the worm gear (300). Rotation of the worm gear turns all of the vessels at once about the axis of the gear. This means for rotating does not change the angle of the long axis of the vessel with respect to the ground, which is fixed upon installation. With the alignment of the long axis of the vessel to the east-west direction, the rotation around the longitudinal axis adjusts for the seasonal changes in the altitude of the sun and any daily adjustment needed due to the slight misalignment. Alternatively, two or more solar cells (341 and 342) are used in the same vessel in the side-by-side fashion. Their relative output intensities response to position is used to provide the tracking signal for fine tuning the rotation of the vessel for maximum output. An external directional sensor of the position of the sun is added when a larger range of adjustment is desired.

The means for rotating may include other tracking devices that are well known in the art. These included fully self contained devices that change the orientation of the apparatus. All that need be done to utilize such an alternative sun-tracking device is to mount one or more of the apparatus (100) on the means for rotating (300).

The above-described embodiments including the drawings are examples of the invention and merely provide illustrations of the invention. Other embodiments will be obvious to those skilled in the art. Thus, the scope of the invention is determined by the appended claims and their legal equivalents rather than by the examples given.

What is claimed is:

1. An apparatus for collecting solar radiation for electricity production and heat comprising:
    (a) a liquid that is non-conducting and optically transparent;
    (b) a vessel substantially filled with the liquid comprising,
        (i) a wall, said wall being optically transparent and having a refractive index about the same as the liquid and wherein said wall is shaped in cross-section to comprise
            a top having a flat exterior surface such that solar radiation passing through the top enters the vessel in substantially parallel rays, and, a bottom having a concave exterior surface that is coated with a reflective material such that parallel rays of solar radiation traveling through said bottom and striking the reflective material is reflected back through said bottom to a focal line adjacent to the interior surface of the top, and,
        (ii) an entry port to enable introduction of cooled liquid into the vessel;
        (iii) an exit port to enable removal of liquid heated by solar radiation; and,
    (c) a photovoltaic solar cell located adjacent to the interior surface of the top aligned with the focal line.

2. The apparatus of claim 1 wherein the liquid is silicon oil.

3. The apparatus of claim 1 wherein the concave exterior surface is parabolic.

4. The apparatus of claim 1 further comprising a means for rotating the apparatus such that sunlight impinges substantially latitudinally perpendicularly to the flat exterior surface of the top.

* * * * *